United States Patent
Ewing et al.

(10) Patent No.: US 12,353,246 B2
(45) Date of Patent: Jul. 8, 2025

(54) NARROW DISPLAY BORDERS USING A DISPLAY-TO-FRAME INTERPOSER

(71) Applicant: Google LLC, Mountain View, CA (US)

(72) Inventors: Tyler Jon Ewing, San Francisco, CA (US); Adam Joseph Brinkman, Sunnyvale, CA (US); Michael J. Lombardi, South Barrington, IL (US); Ssu-Chieh Yu, New Taipei (TW); Joseph Allore, Mundelein, IL (US); Qian Wang, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/458,286

(22) Filed: Aug. 30, 2023

(65) Prior Publication Data
US 2023/0409081 A1 Dec. 21, 2023

Related U.S. Application Data

(60) Provisional application No. 63/579,468, filed on Aug. 29, 2023.

(51) Int. Cl.
*G06F 1/16* (2006.01)
*H05K 5/10* (2025.01)

(52) U.S. Cl.
CPC .......... *G06F 1/1641* (2013.01); *G06F 1/1658* (2013.01); *H05K 5/10* (2025.01)

(58) Field of Classification Search
CPC .... G06F 1/1641; G06F 1/1658; G06F 1/1637; G06F 1/1626; H05K 5/0004; H04M 1/0266
See application file for complete search history.

(56) References Cited

U.S. PATENT DOCUMENTS

| | | | |
|---|---|---|---|
| 8,610,822 B2 | 12/2013 | Weber et al. | |
| 9,177,904 B2 * | 11/2015 | Jung | H01L 25/167 |
| 9,570,019 B2 | 2/2017 | Musgrave et al. | |
| 9,736,931 B2 * | 8/2017 | Eom | H05K 1/028 |

(Continued)

FOREIGN PATENT DOCUMENTS

| | | |
|---|---|---|
| CN | 103488364 A | 1/2014 |
| CN | 111241890 | 6/2020 |

(Continued)

OTHER PUBLICATIONS

"Final Office Action", U.S. Appl. No. 18/328,998, filed Jul. 10, 2024, 11 pages.

(Continued)

*Primary Examiner* — Rockshana D Chowdhury
*Assistant Examiner* — Martin Antonio Asmat Uceda
(74) *Attorney, Agent, or Firm* — Colby Nipper PLLC

(57) ABSTRACT

This document describes systems and techniques for narrow display borders using a display-to-frame interposer ("interposer"). In aspects, the interposer is bonded, on a first side, to a mechanical frame. On a second side, the interposer is bonded to a backside of a display panel module, including a folded portion, and supports a cover layer through the display panel module. In such a configuration, a display border, which extends from an edge of the cover layer to an active area of the display panel module and resides above the folded portion, can be reduced.

8 Claims, 5 Drawing Sheets

(56) References Cited

U.S. PATENT DOCUMENTS

| | | | |
|---|---|---|---|
| 10,019,121 B2 | 7/2018 | Choi et al. | |
| 10,021,226 B2 | 7/2018 | Gagne-keats et al. | |
| 10,068,551 B1 | 9/2018 | Choi et al. | |
| 10,440,839 B2 | 10/2019 | Cheng | |
| 10,742,788 B2 | 8/2020 | Shin et al. | |
| 10,777,621 B2 | 9/2020 | Lee et al. | |
| 10,791,207 B2* | 9/2020 | Fournier | H04M 1/0269 |
| 10,838,452 B2 | 11/2020 | Siddiqui et al. | |
| 10,890,954 B2 | 1/2021 | Evans et al. | |
| 11,068,029 B2* | 7/2021 | Jeong | G06F 1/1652 |
| 11,163,334 B2* | 11/2021 | Kang | G06F 1/1601 |
| 11,163,970 B1 | 11/2021 | Sammoura et al. | |
| 11,412,120 B2 | 8/2022 | Manea et al. | |
| 11,592,876 B2* | 2/2023 | Kim | G06F 1/1641 |
| 11,672,139 B2* | 6/2023 | Jung | H10K 50/8426 257/680 |
| 11,782,483 B2 | 10/2023 | Lonbardi et al. | |
| 12,003,019 B2* | 6/2024 | de Jong | G04R 60/14 |
| 12,029,071 B2* | 7/2024 | Tao | H10K 77/10 |
| 12,078,778 B2* | 9/2024 | Kim | H10K 59/8794 |
| 12,079,036 B2* | 9/2024 | Barrett | G06F 1/163 |
| 2002/0050958 A1 | 5/2002 | Matthies et al. | |
| 2002/0067326 A1 | 6/2002 | Aoki | |
| 2006/0093928 A1 | 5/2006 | Hung et al. | |
| 2006/0124209 A1 | 6/2006 | Schroers et al. | |
| 2007/0070272 A1 | 3/2007 | Gettemy et al. | |
| 2007/0200968 A1 | 8/2007 | Chang | |
| 2008/0055210 A1 | 3/2008 | Cok | |
| 2008/0123032 A1 | 5/2008 | Taniguchi et al. | |
| 2010/0053853 A1 | 3/2010 | Allore et al. | |
| 2010/0207860 A1 | 8/2010 | Chang et al. | |
| 2011/0104855 A1 | 5/2011 | Lin et al. | |
| 2011/0175852 A1 | 7/2011 | Goertz et al. | |
| 2011/0255000 A1 | 10/2011 | Weber et al. | |
| 2012/0120098 A9 | 5/2012 | Faulkner et al. | |
| 2012/0218219 A1 | 8/2012 | Rappoport et al. | |
| 2013/0088671 A1 | 4/2013 | Drzaic et al. | |
| 2013/0256672 A1 | 10/2013 | Kimura | |
| 2013/0342519 A1 | 12/2013 | Kim et al. | |
| 2014/0016076 A1 | 1/2014 | Braganza et al. | |
| 2014/0118985 A1 | 5/2014 | Hassember | |
| 2014/0175623 A1 | 6/2014 | Pagaila et al. | |
| 2014/0217382 A1 | 8/2014 | Kwon et al. | |
| 2014/0218321 A1 | 8/2014 | Lee et al. | |
| 2014/0240911 A1 | 8/2014 | Cole et al. | |
| 2014/0265822 A1 | 9/2014 | Drzaic et al. | |
| 2014/0292628 A1 | 10/2014 | Park | |
| 2015/0070826 A1 | 3/2015 | Montevirgen et al. | |
| 2015/0138434 A1 | 5/2015 | Chuang et al. | |
| 2015/0216024 A1 | 7/2015 | Kwong | |
| 2015/0301417 A1 | 10/2015 | Park et al. | |
| 2015/0331292 A1 | 11/2015 | Yang et al. | |
| 2016/0063933 A1 | 3/2016 | Kobayashi et al. | |
| 2016/0078838 A1 | 3/2016 | Huang et al. | |
| 2016/0210923 A1 | 7/2016 | Yoshida et al. | |
| 2016/0218151 A1 | 7/2016 | Kwon et al. | |
| 2016/0227654 A1 | 8/2016 | Kim et al. | |
| 2016/0282987 A1 | 9/2016 | Choi et al. | |
| 2016/0337570 A1 | 11/2016 | Tan et al. | |
| 2017/0004760 A1 | 1/2017 | Jang et al. | |
| 2017/0062547 A1 | 3/2017 | Mathew et al. | |
| 2017/0092196 A1 | 3/2017 | Gupta et al. | |
| 2017/0116932 A1 | 4/2017 | Musgrave et al. | |
| 2017/0168463 A1 | 6/2017 | Hong et al. | |
| 2017/0179432 A1 | 6/2017 | Visweswaran et al. | |
| 2017/0251086 A1 | 8/2017 | Gagne-keats et al. | |
| 2017/0287992 A1 | 10/2017 | Kwak et al. | |
| 2017/0322357 A1 | 11/2017 | De Jong et al. | |
| 2017/0374749 A1 | 12/2017 | Lee et al. | |
| 2018/0090713 A1 | 3/2018 | Lee | |
| 2018/0095502 A1 | 4/2018 | Yamazaki et al. | |
| 2018/0137332 A1 | 5/2018 | Andersen et al. | |
| 2018/0260602 A1 | 9/2018 | He et al. | |
| 2018/0277051 A1 | 9/2018 | Du | |
| 2019/0052904 A1 | 2/2019 | He et al. | |
| 2019/0123112 A1 | 4/2019 | Lee et al. | |
| 2019/0132001 A1 | 5/2019 | Deng et al. | |
| 2019/0180691 A1 | 6/2019 | Takasugi | |
| 2019/0228740 A1 | 7/2019 | Aflatooni et al. | |
| 2019/0303639 A1 | 10/2019 | He et al. | |
| 2020/0117933 A1 | 4/2020 | Chang et al. | |
| 2020/0241594 A1 | 7/2020 | Cavallaro | |
| 2020/0273427 A1 | 8/2020 | Wang | |
| 2020/0273919 A1 | 8/2020 | Ding et al. | |
| 2020/0324521 A1 | 10/2020 | Park et al. | |
| 2020/0327348 A1 | 10/2020 | Kim | |
| 2021/0020698 A1 | 1/2021 | Xianyu et al. | |
| 2021/0174711 A1 | 6/2021 | Cho et al. | |
| 2021/0183333 A1 | 6/2021 | Holland et al. | |
| 2021/0192984 A1 | 6/2021 | Yoo et al. | |
| 2021/0201731 A1 | 7/2021 | Ranjan et al. | |
| 2021/0248350 A1 | 8/2021 | Chang et al. | |
| 2021/0286407 A1 | 9/2021 | Kim et al. | |
| 2021/0297563 A1 | 9/2021 | Manea et al. | |
| 2021/0367173 A1 | 11/2021 | Lee et al. | |
| 2021/0408140 A1 | 12/2021 | Han et al. | |
| 2022/0043488 A1 | 2/2022 | Lombardi et al. | |
| 2022/0050506 A1 | 2/2022 | Gehlen et al. | |
| 2022/0058254 A1 | 2/2022 | Park et al. | |
| 2022/0091637 A1 | 3/2022 | Kuon et al. | |
| 2022/0103672 A1 | 3/2022 | Jung et al. | |
| 2022/0312604 A1 | 9/2022 | Feng et al. | |
| 2022/0391086 A1 | 12/2022 | Westerman | |
| 2023/0021348 A1 | 1/2023 | Cho et al. | |
| 2023/0088192 A1 | 3/2023 | Qin et al. | |
| 2023/0142400 A1* | 5/2023 | Wang | G04G 17/08 455/575.7 |
| 2023/0161390 A1 | 5/2023 | Silvanto et al. | |
| 2023/0274573 A1 | 8/2023 | Kim et al. | |
| 2023/0306912 A1 | 9/2023 | Wen et al. | |
| 2023/0315154 A1 | 10/2023 | Manea et al. | |
| 2023/0393618 A1 | 12/2023 | Park et al. | |
| 2024/0057270 A1 | 2/2024 | Zhang et al. | |
| 2024/0105142 A1 | 3/2024 | Jeon et al. | |
| 2024/0129401 A1 | 4/2024 | Park et al. | |
| 2024/0161548 A1 | 5/2024 | Kim et al. | |
| 2024/0179859 A1 | 5/2024 | Liu et al. | |
| 2024/0193985 A1 | 6/2024 | Sammoura et al. | |
| 2024/0248512 A1 | 7/2024 | Tang et al. | |
| 2024/0264740 A1 | 8/2024 | Zou et al. | |
| 2024/0288907 A1* | 8/2024 | Qu | G06F 1/1652 |
| 2024/0329690 A1* | 10/2024 | An | H04M 1/026 |
| 2025/0169012 A1 | 5/2025 | Lombardi et al. | |

FOREIGN PATENT DOCUMENTS

| | | |
|---|---|---|
| CN | 111477135 | 7/2020 |
| CN | 111882993 A | 11/2020 |
| CN | 112331145 | 2/2021 |
| CN | 113593416 | 11/2021 |
| CN | 113724631 A | 11/2021 |
| CN | 114387875 | 4/2022 |
| CN | 114913773 | 8/2022 |
| CN | 116711290 A | 9/2023 |
| CN | 117119088 | 11/2023 |
| CN | 117351895 A | 1/2024 |
| EP | 2993871 | 3/2016 |
| EP | 3399728 | 11/2018 |
| KR | 20060124209 | 12/2006 |
| KR | 20120120098 | 11/2012 |
| KR | 102381327 | 4/2022 |
| TW | 202318385 A | 5/2023 |
| WO | 2000045605 | 8/2000 |
| WO | 2020156309 | 8/2020 |
| WO | 2020215878 | 10/2020 |
| WO | 2022046025 | 3/2022 |
| WO | 2022132370 | 6/2022 |
| WO | 2022232996 | 11/2022 |

OTHER PUBLICATIONS

"Foreign Office Action", IN Application No. 202247031876, Aug. 7, 2023, 7 pages.

(56) References Cited

OTHER PUBLICATIONS

"Foreign Office Action", JP Application No. 2022-536640, Sep. 5, 2023, 4 pages.
"International Preliminary Report on Patentability", Application No. PCT/US2020/047670, Feb. 28, 2023, 10 pages.
"International Search Report and Written Opinion", Application No. PCT/US2020/047670, May 12, 2021, 13 pages.
"LG Introduces New Foldable Display Tech That's Hard as Glass, Has no Creases", https://www.gsmarena.com/lg_introduces_new_foldable_display_material_with_no_creases_hard_as_glass-news-50837.php, Sep. 7, 2021, 1 page.
"Non-Final Office Action", U.S. Appl. No. 17/507,293, filed Feb. 17, 2023, 7 pages.
"Notice of Allowance", U.S. Appl. No. 17/507,293, filed Jun. 28, 2023, 7 pages.
Antonio-Torres, et al., "LUT-based compensation model for OLED degradation", May 2005, pp. 435-441.
Choi, Sangmoo, "Deposition of Black Material on Metal Traces Surrounding Display Deposition of Black Material on Metal Traces Surrounding Display Screen Blind-Holes to Increase Camera Performance and Improve Screen Blind-Holes to Increase Camera Performance and Improve Ae", Technical Disclosure Commons—https://www.tdcommons.org/dpubs_series/4321, May 25, 2021, 10 pages.
Choi, et al., "Expediting Fingerprint Authentication by Compensating for Display Luminance Latency", Technical Disclosure Commons, https://www.tdcommons.org/dpubs_series/4686, Oct. 29, 2021, 11 pages.
Choi, et al., "Light-Guiding Structure For Under-Display Sensor Modules", Technical Disclosure Commons; https://www.tdcommons.org/dpubs_series/3527, Aug. 17, 2020, 8 pages.
Dondzik, Daniel, "Adhesiveless Display Panel Attachment", Technical Disclosure Commons; Retrieved from https://www.tdcommons.org/dpubs_series/3307, Jun. 9, 2020, 8 pages.
Holland, Patrick, "Motorola's Razr folds in half without a crease. The secret is in the hinge design", https://www.cnet.com/tech/mobile/motorola-razr-folds-in-half-without-crease-secret-hinge-design/, Feb. 5, 2020, 6 pages.
Hou, et al., "Foldable Display Stack-Up Structures with a Divided Thin Glass Layer", Technical Disclosure Commons—https://www.tdcommons.org/dpubs_series/6406, Nov. 8, 2023, 10 pages.
Hsiu, et al., "Improved Foldable Display Structures with Electrostatic Discharge Improved Foldable Display Structures with Electrostatic Discharge Mitigation Structures Mitigation Structures", Technical Disclosure Commons—https://www.tdcommons.org/dpubs_series/6537, Dec. 25, 2023, 11 pages.
Kim, et al., "Pixel Burn-In Compensation Parameter Compression for Organic Light Emitting Diode Displays", Technical Disclosure Commons, https://www.tdcommons.org/dpubs_series/5871, May 8, 2023, 12 pages.
Lombardi, et al., "Adaptive User Interface for a Camera Aperture within an Active Display Area", Technical Disclosure Commons; Retrieved from https://www.tdcommons.org/dpubs_series/2719, Nov. 25, 2019, 12 pages.
Matei, Mihai, "Samsung's Ultra-Thin Glass is no Good for Large Foldable Tablets or Laptops", https://www.sammobile.com/news/samsung-ultra-thin-glass-no-good-for-large-foldable-tablets-laptops/, Aug. 29, 2022, 5 pages.
Skanda, Sai, "Xiaomi Mi 9 to Feature an Improved In-screen Fingerprint Sensor", https://www.gizchina.com/2019/02/17/mi-9-fingerprint-improved-fingerprint/, Feb. 17, 2019, 10 pages.
"Non-Final Office Action", U.S. Appl. No. 18/328,998, filed Apr. 3, 2024, 9 pages.
"Restriction Requirement", U.S. Appl. No. 18/328,998, filed Feb. 1, 2024, 5 pages.
Bai, et al., "On-Pixel Ratio-Based Adjustment of Local High Brightness Control", Oct. 8, 2024, 13 pages.
Eltoft, et al., "Adaptive Maximum Fingerprint Touch-Size Threshold for Reduced Unintended Authentication Attempts and Reduced Spoof Accept Rate", Technical Disclosure Commons, https://www.tdcommons.org/dpubs_series/7586, Nov. 22, 2024, 12 pages.
"International Search Report and Written Opinion", Application No. PCT/US2021/059750, Feb. 25, 2022, 11 pages.
"Notice of Allowance", U.S. Appl. No. 17/139,465, filed May 18, 2022, 9 pages.
"Samsung Galaxy Z Flip: Top Features", Accessed online at: https://www.themobileindian.com/picture-story/samsung-galaxy-z-flip-top-features-1309-14229 on Oct. 20, 2020, Feb. 15, 2020, 6 pages.
Choi, Sangmoo, "Clock Trace Structure for Block Sequential Clock Driving", Technical Disclosure Commons, https://www.tdcommons.org/dpubs_series/4786, Dec. 19, 2021, 11 pages.
Choi, et al., "Dynamically Altering Clock Signal Frequencies in LTPO AMOLED Displays", Technical Disclosure Commons, https://www.tdcommons.org/dpubs_series/4652, Oct. 12, 2021, 11 pages.
Choi, et al., "Readability Enhancements for Device Displays used in BrightReadability Enhancements for Device Displays used in BrightLighting Conditions", Technical Disclosure Commons—https://www.tdcommons.org/dpubs_series/3871, Dec. 10, 2020, 9 pages.
Iorga, Radu, "Huawei Mate X2 5G Gets Rendered And Looks a Lot Like the Galaxy Z Fold 2 5G", Accessed online at: https://tablet-news.com/huawei-mate-x2-5g-gets-rendered-and-looks-a-lot-like-the-galaxy-z-fold-2-5g/ on Oct. 20, 2020, Oct. 13, 2020, 3 pages.
Li-Fong, et al., "A Circular Flexible Amoled Display with a 1-mm Slim Border", May 25, 2016, pp. 847-850.
Lih, et al., "A True Circular 1.39 Inch Amoled for Wearable Application", May 2016, pp. 566-569.
Lin, et al., "Preventing Dust Ingression into a Foldable Mobile Device", Technical Disclosure Commons, https://www.tdcommons.org/dpubs_series/7587, Nov. 22, 2024, 8 pages.
Subramaniam, Vaidyanathan, "LG Patents a True Bezel-Less Smartphone Display with an In-Display Selfie Camera", Accessed online at: https://www.notebookcheck.net/LG-patents-a-true-bezel-less-smartphone-display-with-an-in-display-selfie-camera.357626.0.html on Oct. 20, 2020, Nov. 7, 2018, 4 pages.
Wakser, et al., "Form-in-Place Adhesive Gasket to Waterproof an Electronic Device", Technical Disclosure Commons; Retrieved from https://www.tdcommons.org/dpubs_series/3239, May 18, 2020, 7 pages.
Wen, et al., "Improving Under-Display Fingerprint Authentication Latency by Normalizing Frame Luminance", Technical Disclosure Commons—https://www.tdcommons.org/dpubs_series/5006, Mar. 24, 2022, 12 pages.
Yonebayashi, et al., "High refresh rate and low power consumption AMOLED panel using top-gate n-oxide and p-LTPS TFTs", Mar. 2020, 10 pages.
Chen, et al., "Improved Foldable Display Structures with Multi-Layer Coatings and Planarization", Technical Disclosure Commons, https://www.tdcommons.org/dpubs_series/6685, Feb. 14, 2024, 12 pages.

* cited by examiner

PRIOR ART ns NARROW DISPLAY BORDERS USING A
DISPLAY-TO-FRAME INTERPOSER

CROSS-REFERENCE TO RELATED
APPLICATION(S)

This application claims priority to U.S. Provisional Patent Application Ser. No. 63/579,468 filed on Aug. 29, 2023, the disclosure of which is incorporated by reference herein in its entirety.

SUMMARY

This document describes systems and techniques for narrow display borders using a display-to-frame interposer ("interposer"). In aspects, the interposer is bonded, on a first side, to a mechanical frame. On a second side, the interposer is bonded to a backside of a display panel module, including a folded portion, and supports a cover layer through the display panel module. In such a configuration, a display border, which extends from an edge of the cover layer to an active area of the display panel module and resides above the folded portion, can be reduced.

In implementations, an electronic device is disclosed that includes a mechanical frame having an internal cavity within which one or more electronic components are disposed and a display positioned at least partially within the internal cavity. The display includes a cover layer having an exterior face and an opposing interior face, as well as a display panel module having a topside and an opposing backside. The topside of the display panel module is configured to be bonded to the interior face of the cover layer. The display panel module further includes a folded portion contiguous with and extending from the display panel module. The folded portion is bent over onto itself in a direction opposite of the cover layer such that the folded portion is positioned adjacent to the backside of the display panel module. The electronic device further includes an interposer positioned between the mechanical frame and the display. The interposer is configured to be bonded to at least portions of the backside of the display panel module and the folded portion.

This Summary is provided to introduce simplified concepts of systems and techniques for narrow display borders using a display-to-frame interposer, the concepts of which are further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of systems and techniques for narrow display borders using a display-to-frame interposer are described in this document with reference to the following drawings.

The same numbers are used throughout the Drawings to reference like features and components.

DETAILED DESCRIPTION

Overview

Figure 1:
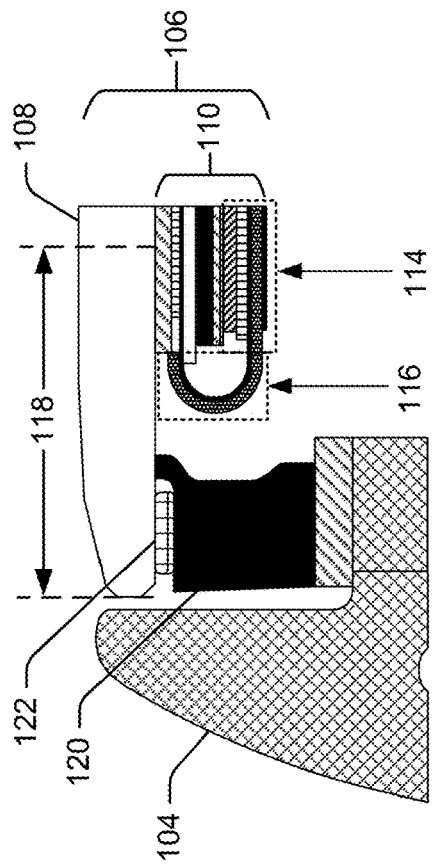
FIG. 1 illustrates an example implementation of a conventional electronic device having a display module with a folded portion and a display bend.
Figure 1:
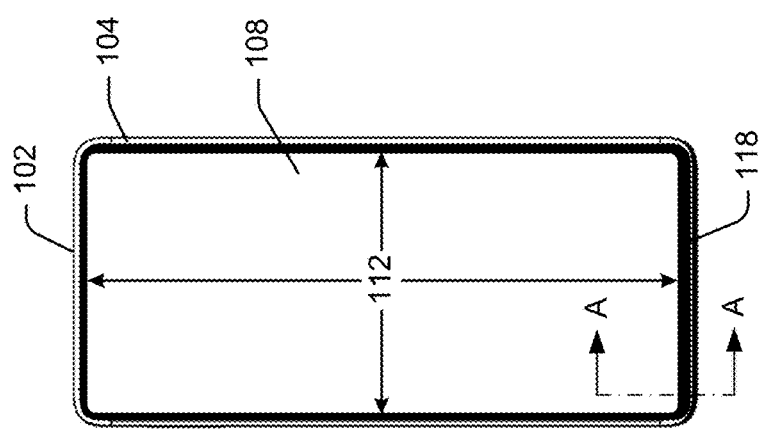

This document describes systems and techniques for narrow display borders using a display-to-frame interposer. Many electronic devices include displays, such as light-emitting diode (LED) displays or liquid crystal displays (LCDs). Electronic device manufacturers fabricate displays in a layered structure ("display panel stack"). The display panel stack includes a display module having a display panel that, when integrated into an electronic device, is disposed underneath and shielded by a cover layer. The display panel stack may further include one or more of a touch layer (e.g., touch sensor panel), a polarizer layer (e.g., polarization filters), an adhesive layer, and/or a protective layer (e.g., an EMBO layer).

The protective layer may include one or more sublayers, such as a polymer sublayer (e.g., polyethylene terephthalate (PET) substrate), a metallic sublayer (e.g., copper, stainless steel), a foam pad (e.g., to absorb compressive forces during manufacturing or usage), and an adhesive sublayer. The protective layer shields delicate display panels from both mechanical and electromagnetic forces, as well as from thermal radiation.

Any physical or electrical damage to a display panel can quickly render portions of the display panel inoperable, spoiling user experience. Thus, display panels are handled with great care during manufacturing and are often surrounded by many shielding components, including the protective layer and the cover layer, for protection during manufacturing and/or device usage. Not only are display panels delicate, but they are also elaborate, requiring sophisticated manufacturing techniques to intricately design an array of pixel circuits within the display of the display module. Pixel arrays include tens of thousands of pixels organized into a two-dimensional grid (e.g., a circular or rectangular grid). Each of the pixel circuits may include an organic light-emitting diode ("pixel") composed of, for example, a red sub-pixel, a green sub-pixel, and/or a blue sub-pixel. To power and control the pixel array, display modules often include routing circuitry, surrounding a perimeter of the pixel array, connecting the pixels to one or more drivers. In one example, a pixel array having a two-dimensional rectangular grid of pixels is operably coupled to one or more row-line drivers via electrical traces (e.g., wires). Electronic devices can, via the one or more drivers, control any of the pixels within a display panel to illuminate at various intensities and wavelengths (e.g., combined wavelengths of the sub-pixels), effective to produce on-screen content (e.g., images). Such display panels are well-suited for electronic devices, and are further appreciated by users, in large part, because of their image quality.

Before a cover layer is positioned above or on top of a display panel stack, an opaque border, often referred to as an "ink mask," is added to the underside of the cover layer, defining a display bezel. An amount of space consumed by the electrical traces often dictates a size of the display bezel, especially in corner regions. The display bezel acts as a frame, hiding routing circuitry in an inactive area (e.g., non-emissive area) and surrounding an active area of a display (e.g., an emissive area of a display module visible to a user).

In some implementations, a portion of the display module includes routing circuitry, flexible flat cables (FCCs), one or more drivers, and/or a controller board (e.g., an integrated driving circuit) that is folded over onto itself in a direction opposite of the cover layer ("folded portion"). In this way, an inactive area of the display module is minimized, while the active area is maximized. Generally, a display module is positioned within an electronic device such that a display bend and the folded portion are disposed at a bottom of the device. Because of the delicacy of the display panels, the folded portion of a display module, particularly the display bend, is rarely designed to contact other components within an electronic device, including interior housing components. For this reason, the display bend and the folded portion of a display module can occupy a considerable amount of space within an electronic device, leading to increased display borders.

Users of electronic devices often desire compact, aesthetic electronic devices with large display active areas and small display borders. However, many electronic devices have displays with large display bezels that hide inactive areas of a display panel, particularly the region within which a display bend resides. To this end, this document describes systems and techniques for narrow display borders using a display-to-frame interposer.

FIG. 1 illustrates an example implementation 100 of a conventional electronic device having a display module with a folded portion and a display bend. As illustrated, the conventional electronic device 102 includes a housing 104 and a display panel stack 106 having a cover layer 108 and a display panel module 110. An opaque border 118 may be added to an underside of the cover layer 108, defining an active area 112. A folded portion 114 and a display bend 116 may reduce the active area 112 and be hidden by the opaque border 118. The opaque border 118 above the folded portion 114 and the display bend 116 may be dimensionally larger than other portions of the opaque border 118 due to an additional space provided within the electronic device 102 to accommodate for the display bend 116.

Further illustrated, a plastic trim 120 may attach to and uphold the cover layer 108 via an adhesive 122. This plastic trim 120 may be contoured with a particular design to both provide ample space for the display bend 116 and connect the housing 104 to the cover layer 108. Such a design, however, reduces the active area 112 of a display due to the large opaque border 118, which hides the display bend 116, the plastic trim 120, and the space therebetween.

Example Environment

Figure 2:
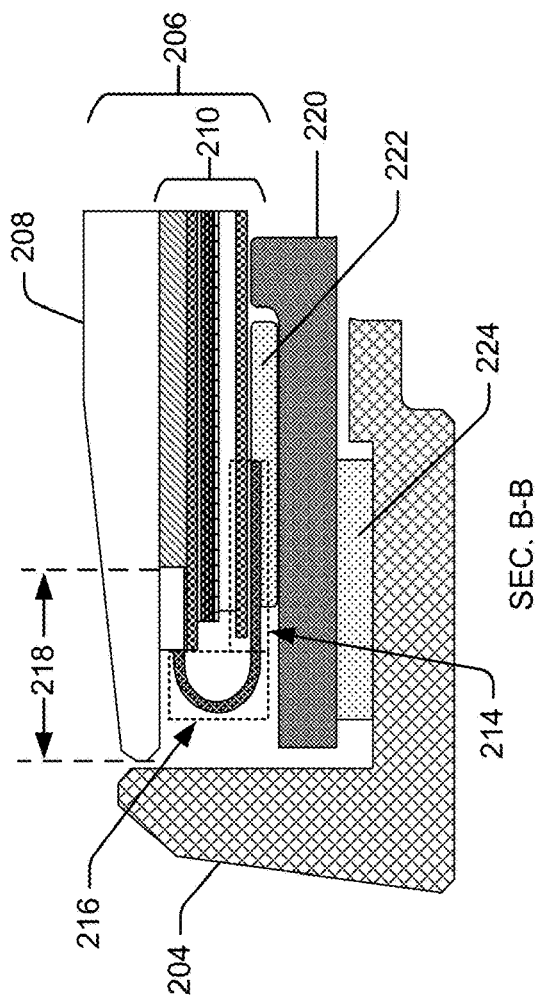
FIG. 2 illustrates an example implementation of an example electronic device having a display module with a folded portion and a display bend, as well as a display-to-frame interposer in accordance with one or more implementations.
Figure 2:
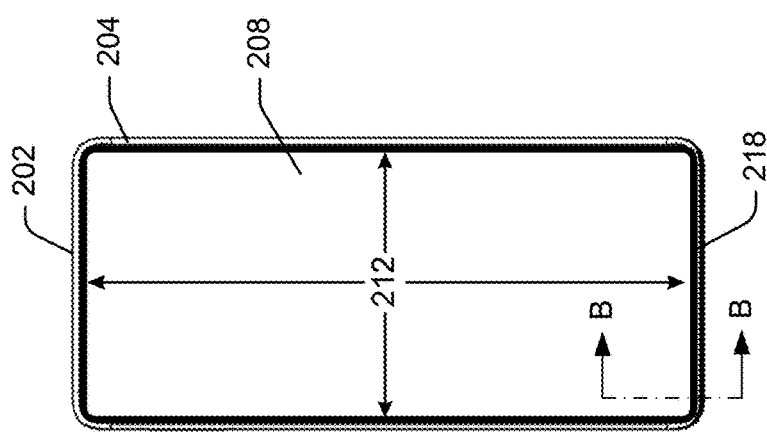
Figure 2:
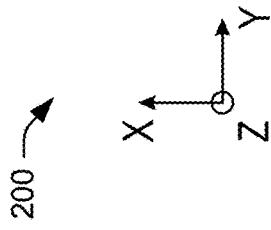

FIG. 2 illustrates an example implementation 200 of an example electronic device having a display module with a folded portion and a display bend, as well as a display-to-frame interposer in accordance with one or more implementations. As illustrated, the example electronic device 202 includes a housing 204 (e.g., a frame) and a display panel stack 206 having a cover layer 208 and a display panel module 210. An opaque border 218 may be added to an underside of the cover layer 208, defining an active area 212. A folded portion 214 and a display bend 216, which extend from and are contiguous with the display panel module 210, may be hidden by the opaque border 218.

Further illustrated, a display-to-frame interposer 220 ("interposer 220") is positioned between the housing 204 and the display panel module 210. In implementations, an adhesive 222, such as a liquid-dispensed adhesive (LDA), is disposed between the interposer 220 and the display panel module 210. In this way, the adhesive 222 bonds to a backside of the display panel module 210, such as a protective layer, including the folded portion 214. A pressure sensitive adhesive (PSA) 224 (or any other type of adhesive) is disposed between the housing 204 and the interposer 220. In such a configuration, the opaque border 218 of the example electronic device 202 may be narrower than the opaque border 118 of the conventional electronic device 102.

Figure 3:
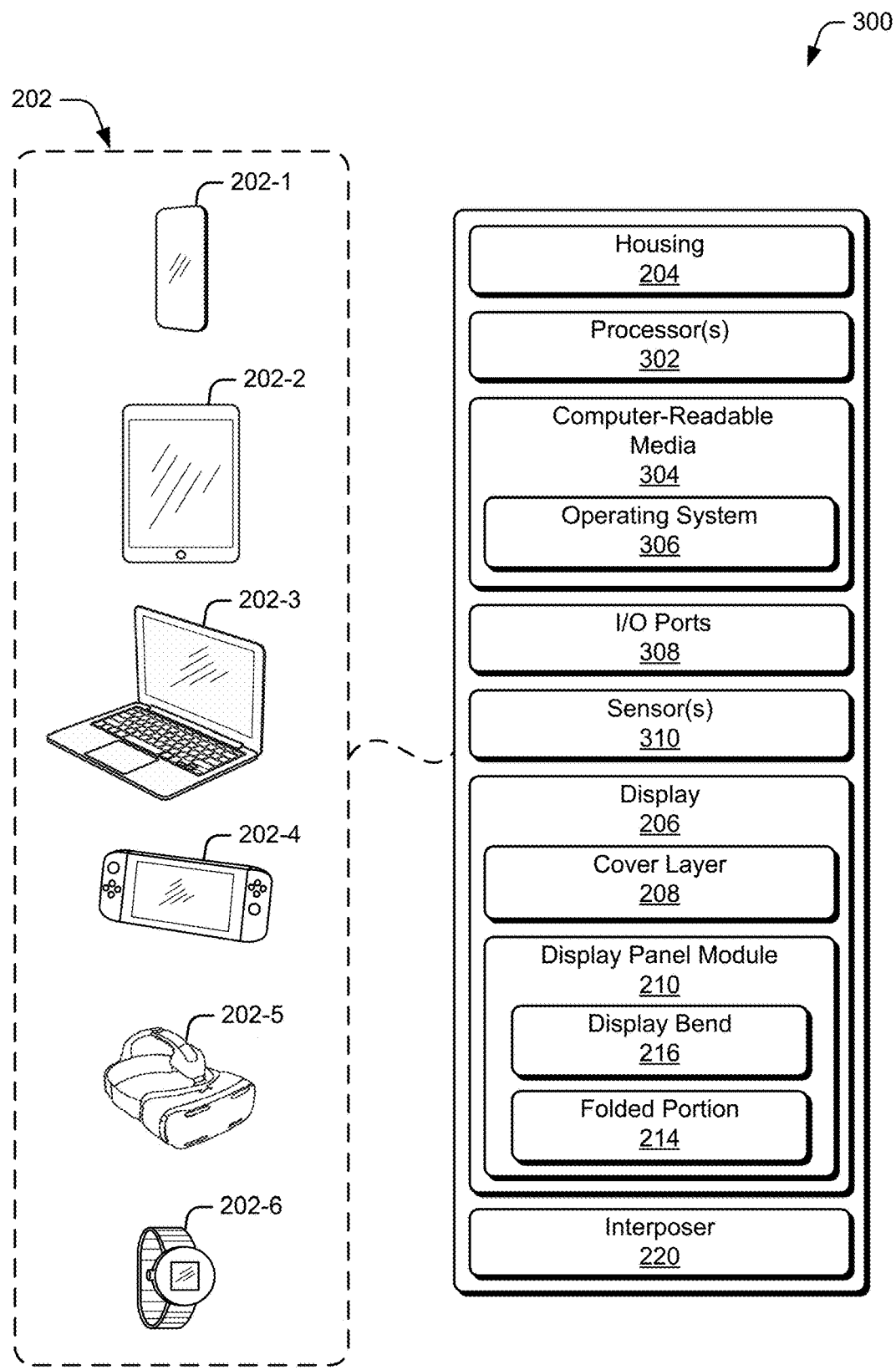
FIG. 3 illustrates an example device diagram of the example electronic device in which narrow display borders using a display-to-frame interposer can be implemented.

FIG. 3 illustrates an example device diagram 300 of the example electronic device 202 in which narrow display borders using a display-to-frame interposer can be implemented. The electronic device 202 may include additional components and interfaces omitted from FIG. 3 for the sake of clarity.

The electronic device 202 can be any of a variety of consumer electronic devices. As non-limiting examples, the electronic device 202 can be a mobile phone 202-1, a tablet device 202-2, a laptop computer 202-3, a portable video game console 202-4, virtual-reality (VR) goggles 202-5, a computerized watch 202-6, and the like.

The electronic device 202 includes a housing 204 which defines at least one internal cavity within which one or more of a plurality of electronic components may be disposed. In implementations, a mechanical frame may define one or more portions of the housing 204. As an example, a mechanical frame can include plastic or metallic walls that define portions of the housing 204. In additional implementations, a mechanical frame may support one or more portions of the housing 204. As an example, one or more exterior housing components (e.g., plastic panels) can be attached to the mechanical frame (e.g., a chassis). In so doing, the mechanical frame physically supports the one or more exterior housing components, which define portions of the housing 204. In implementations, the mechanical frame and/or the exterior housing components may be composed of crystalline or non-crystalline (e.g., metals, plastics) inorganic solids.

These mechanical frames can be designed in a variety of configurations. In implementations the mechanical frame may be designed with a bucket architecture. As an example, a mechanical frame designed with a bucket architecture defines an open-sided polyhedron (e.g., an open-sided rectangular prism). In additional implementations, the mechanical frame may be designed with a mid-frame architecture. In either architecture, a mechanical frame may include more than one open side, defining a partial or full skeletal polyhedra (e.g., a polyhedron structure in which vertices and edges are defined by rods and two or more faces are absent). Exterior housing components (e.g., plastic panels) can then be attached to the mechanical frame to define an open-sided polyhedron. In any implementation, the housing may be sealed through the inclusion of a display (e.g., the cover layer 208), defining at least one internal cavity.

The electronic device 202 may further include one or more processors 302. The processor(s) 302 can include, as non-limiting examples, a system on a chip (SoC), an application processor (AP), a central processing unit (CPU), or a graphics processing unit (GPU). The processor(s) 302 generally executes commands and processes utilized by the electronic device 202 and an operating system 306 installed thereon. For example, the processor(s) 302 may perform operations to display graphics of the electronic device 202 on a display and can perform other specific computational tasks.

The electronic device 202 may also include computer-readable storage media (CRM) 304. The CRM 304 may be a suitable storage device configured to store device data of the electronic device 202, user data, and multimedia data. The CRM 304 may store an operating system that generally manages hardware and software resources (e.g., the applications) of the electronic device 202 and provides common services for applications stored on the CRM 304. The operating system and the applications are generally executable by the processor(s) 302 to enable communications and user interaction with the electronic device 202. One or more processor(s) 302, such as a GPU, perform operations to display graphics of the electronic device 202 on the display 206 and can perform other specific computational tasks. The processor(s) 302 can be single-core or multiple-core processors.

The electronic device 202 may also include input/output (I/O) ports 308. The I/O ports 308 allow the electronic device 202 to interact with other devices or users. The I/O ports 308 may include any combination of internal or external ports, such as universal serial bus (USB) ports, audio ports, Serial ATA (SATA) ports, PCI-express based ports or card-slots, secure digital input/output (SDIO) slots, and/or other legacy ports.

The electronic device 202 may further include one or more sensors 310. The sensor(s) 310 can include any of a variety of sensors, such as an audio sensor (e.g., a microphone), a touch-input sensor (e.g., a touchscreen), an image-capture device (e.g., a camera, video-camera), proximity sensors (e.g., capacitive sensors), an under-display fingerprint sensor, or an ambient light sensor (e.g., photodetector). In implementations, the electronic device 202 includes one or more of a front-facing sensor(s) and a rear-facing sensor(s).

Further, the electronic device 202 includes a display 206 (e.g., a display panel stack) having a cover layer 208 and a display panel module 210. The cover layer 208 may be composed of any of a variety of transparent materials including polymers (e.g., plastic, acrylic), glass (e.g., tempered glass), and so forth, forming any three-dimensional shape. For example, the display panel stack 206 may be implemented as a plastic OLED (POLED) or as a glass OLED (GOLED). During manufacturing, a bottom face of the cover layer 208 may be bonded (e.g., glued) to the display panel module 210 to protect the display panel module 210 as well as to serve as a barrier to ingress contaminants (e.g., dust, water).

The display panel module 210 may include a two-dimensional pixel array forming a grid, operably coupled to one or more row-line drivers via electrical traces. The pixel array generates light to create an image on the display 206 upon electrical activation by one or more drivers. As an example, data-line drivers provide voltage data via electrical traces to the pixel array to control a luminance of individual pixels. A section of the display panel module 210 (e.g., a bottom section) may include more circuitry, such as electrical traces and drivers, than other portions of the display panel module 210 (e.g., a top section, a side section). In such a configuration, the display panel module 210 can be configured such that the section having more circuitry is folded or bent in a direction opposite to the cover layer 208. As a result, the display panel module 210 may include a display bend 216 and a folded portion 214.

Figure 4:
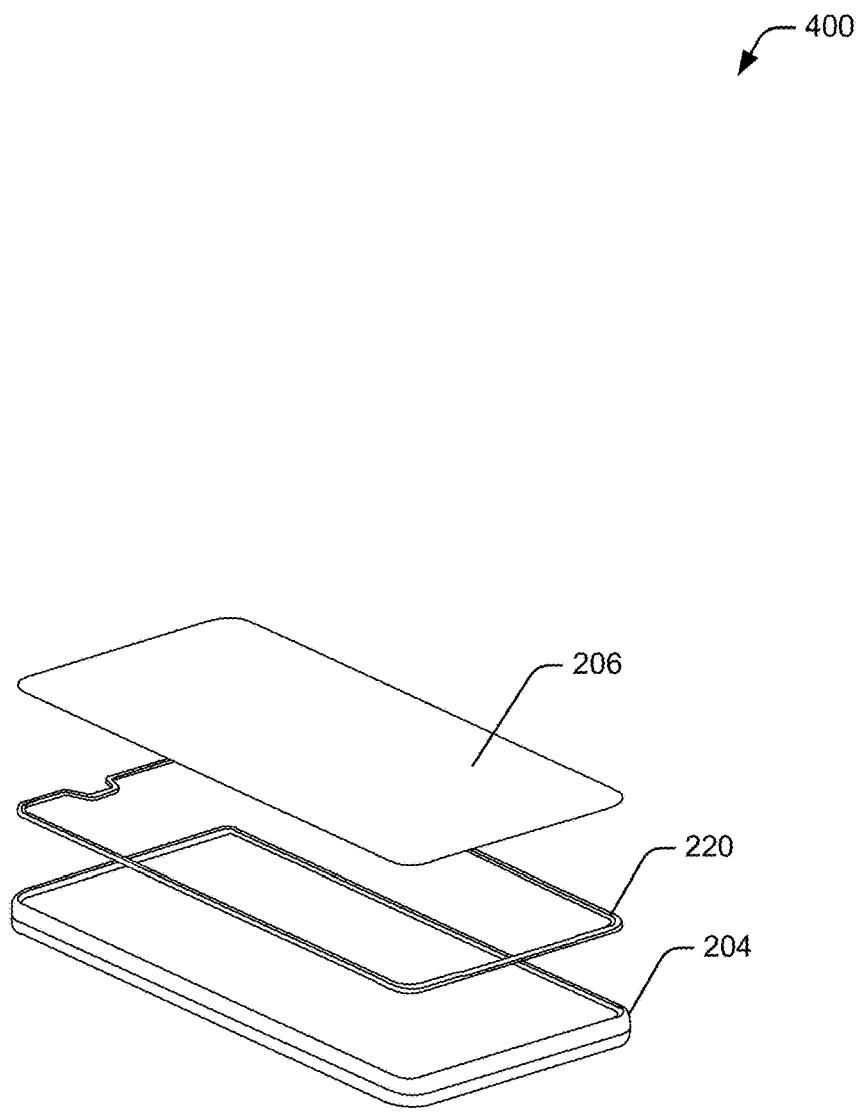
FIG. 4 illustrates an example implementation of an electronic device having the interposer in accordance with one or more implementations.

The electronic device 202 further includes an interposer 220. FIG. 4 illustrates an example implementation 400 of an electronic device 202 having the interposer 220 in accordance with one or more implementations. As illustrated, the interposer 220 is disposed between the housing 204 (e.g., a mechanical frame) and the display 206 (e.g., the display panel module 210). The housing 204 may have at least one internal cavity within which (or above which) the interposer 220 and the display 206 may reside. For instance, the interposer 220 and the display panel module 210 may fit within and seal off the internal cavity. In some implementations, the interposer 220 approximately follows an internal contour of a perimeter (e.g., along an interior perimeter) of the housing 204.

The interposer 220 may be composed of any of a variety of materials, including metals or plastics, and may physically support the display 206 (e.g., indirectly support the cover layer 208 through the display panel module 210). In some implementations, the interposer 220 is attached to the housing 204 via adhesive and/or one or more mechanical mechanisms (e.g., clips). Further, the interposer 220 is bonded to a backside of the display panel module 210, including the folded portion 214 and/or the display bend 216.

Generally, due to the delicacy of the display panel module 210, few, if any, components were designed to intentionally come in contact with the folded portion 214 and/or the display bend 216. Moreover, due to the number of layers and the discontinuity of thickness of the display panel module 210, particularly at the folded portion 214 and the display bend 216, mounting and/or attaching components to the display panel module 210 proved to be a challenge and, as a result, avoided. However, through the use of the display-to-frame interposer 220 and, optionally, a judicious selection of adhesives, attaching the display 206 to the housing 204 via the interposer 220 has proved reliable in water and chemical tests, ball impact tests, and drop and tumble tests.

Figure 5:
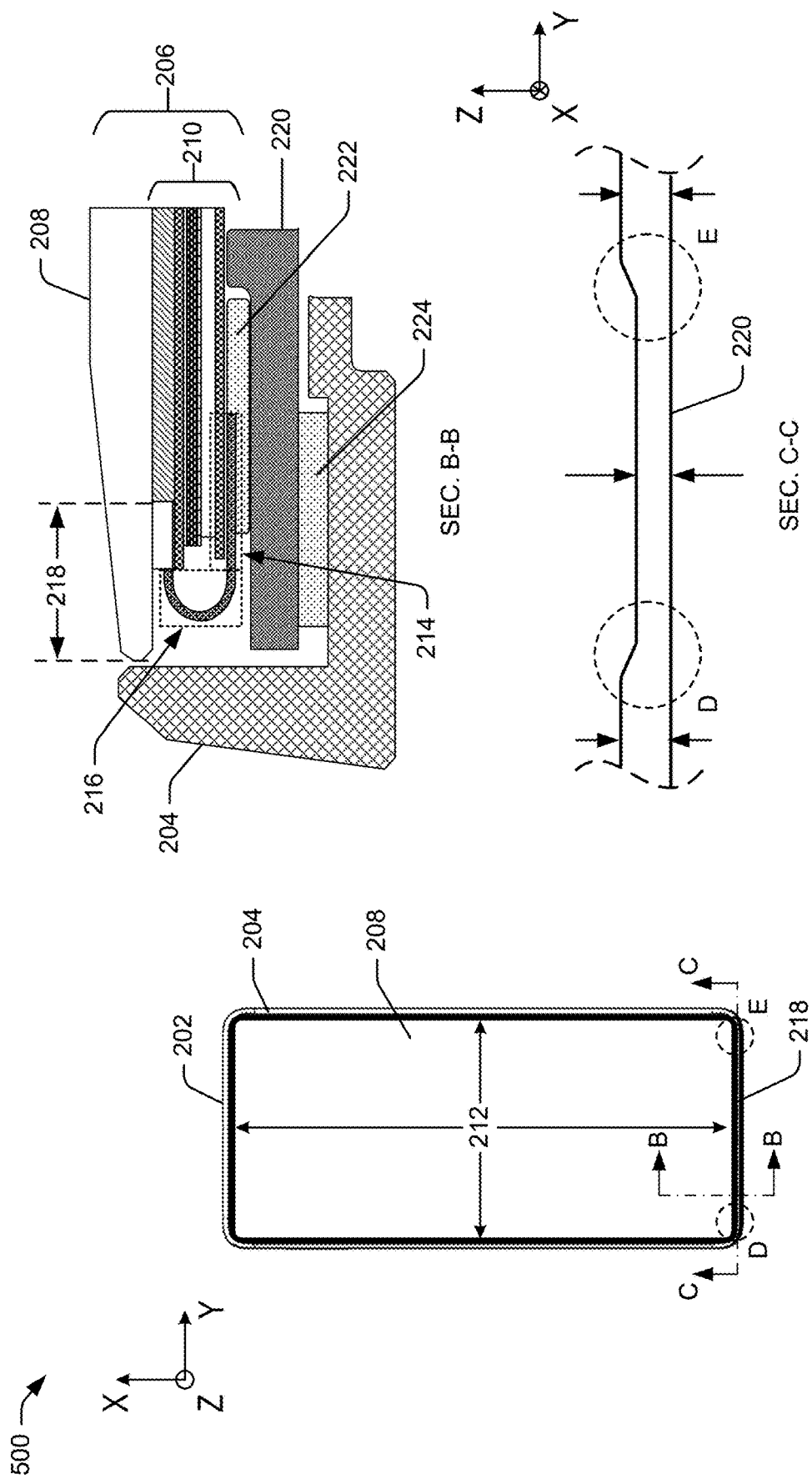
FIG. 5 illustrates an example implementation of the example electronic device from FIG. 2 with additional detail.

Consider FIG. 5, which illustrates an example implementation 500 of the example electronic device from FIG. 2 with additional detail. As illustrated, the example electronic device 202 includes the housing 204 (e.g., a frame) and the display panel stack 206 having the cover layer 208 and the display panel module 210. The opaque border 218 may be added to an underside of the cover layer 208, defining the active area 212. The folded portion 214 and the display bend 216, which extend from and are contiguous with the display panel module 210, may be hidden by the opaque border 218.

Further illustrated, the interposer 220 is positioned between the housing 204 and the display panel module 210. In implementations, the interposer 220 is designed with a dimensional transition (e.g., a "z-step", varying thicknesses) in order to accommodate the increased thickness added by the folded portion 214 and/or the display bend 216. The sloped sections of the interposer 220 (labeled D and E), which interconnect different z-heights, are designed having a slope that enables a consistent deposition of liquid dispensed adhesive with little-to-no run-off. In this way, the adhesive 222 (e.g., a stiff, strong adhesive) bonds the backside of the display panel module 210, including the folded portion 214, to the interposer 220. Further, a pressure sensitive adhesive 224 (e.g., a more compliant adhesive) is disposed between the housing 204 and the interposer 220. Such a configuration not only allows for a smaller opaque border 218, particularly in a bottom of the electronic device 202, but it also provides the electronic device 202 waterproofing capability. Moreover, such a configuration facilitates reworkability. For instance, the pressure sensitive adhesive 224 may be configured to separate under less physical load than the adhesive 222 and, as a result, the display panel module 210 may not be subjected to shear, rips, and/or tears at the backside or at the folded portion 214.

Conclusion

Unless context dictates otherwise, use herein of the word "or" may be considered use of an "inclusive or," or a term that permits inclusion or application of one or more items that are linked by the word "or". Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying Drawings and terms discussed herein may be indicative of one or more items or terms, and thus reference may be made interchangeably to single or plural forms of the items and terms in this written description.

Although implementations for narrow display borders using a display-to-frame interposer have been described in language specific to certain features and/or methods, the subject of the appended Claims is not necessarily limited to the specific features or methods described. Rather, the specific features and methods are disclosed as example implementations for narrow display borders using a display-to-frame interposer.

What is claimed is:

1. An electronic device comprising:
   a mechanical frame having an internal cavity within which one or more electronic components are disposed;
   a display positioned at least partially within the internal cavity, the display comprising:
      a cover layer having an exterior face and an opposing interior face;
      a display panel module having a topside and an opposing backside, the topside of the display panel module configured to be bonded to the interior face of the cover layer; and
      a folded portion contiguous with and extending from the display panel module, the folded portion bent over onto itself in a direction opposite of the cover layer such that the folded portion is positioned adjacent to the backside of the display panel module;
   an interposer positioned between the mechanical frame and the display, the interposer:
      configured to be bonded to at least portions of the backside of the display panel module and the folded portion;
      configured to seal off the internal cavity;
      having a dimensional transition along a lengthwise portion of the interposer that is thinner than first and second portions of the interposer to accommodate the folded portion along at least one side of the mechanical frame; and
      first and second sloped sections joining opposing ends of the dimensional transition to the first and second portions, respectively; and
   a first adhesive configured to bond the interposer to the at least portions of the backside of the display panel module and to the folded portion.

2. The electronic device of claim 1, further comprising a second adhesive configured to bond the interposer to the mechanical frame, wherein the second adhesive is a pressure sensitive adhesive sufficient to seal off the internal cavity.

3. The electronic device of claim 1, wherein the cover layer is physically supported by the interposer through the display panel module.

4. The electronic device of claim 3, wherein the interposer follows an internal contour of the mechanical frame and extends around an entire perimeter of the electronic device.

5. The electronic device of claim 1, wherein the first sloped section and the second sloped section are configured having slopes that enable a consistent deposition of liquid dispensed adhesive with no run-off.

6. The electronic device of claim 1, wherein the display panel module is positioned within the electronic device such that the folded portion is disposed at a bottom-side of the electronic device.

7. The electronic device of claim 6, wherein the dimensional transition is disposed at the bottom-side of the electronic device to accommodate the folded portion, the first and second sloped sections being disposed proximate to first and second corners, respectively, of the electronic device.

8. The electronic device of claim 1, wherein the first adhesive is a liquid-dispensed adhesive.

* * * * *